(12) United States Patent
Shao et al.

(10) Patent No.: US 12,113,432 B2
(45) Date of Patent: Oct. 8, 2024

(54) TRANS-INDUCTOR VOLTAGE REGULATORS WITH FAULT DETECTION AND THE FAULT DETECTION METHOD THEREOF

(71) Applicant: Monolithic Power Systems, Inc., Kirkland, WA (US)

(72) Inventors: Hang Shao, San Jose, CA (US); Tao Zhao, San Jose, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 259 days.

(21) Appl. No.: 17/698,940

(22) Filed: Mar. 18, 2022

(65) Prior Publication Data
US 2023/0299687 A1    Sep. 21, 2023

(51) Int. Cl.
*H02M 1/32* (2007.01)
*H02M 3/158* (2006.01)

(52) U.S. Cl.
CPC ........... *H02M 1/32* (2013.01); *H02M 3/1586* (2021.05)

(58) Field of Classification Search
CPC .............................. H02M 1/32; H02M 3/1586
See application file for complete search history.

(56) References Cited

U.S. PATENT DOCUMENTS

| | | | |
|---|---|---|---|
| 2022/0109368 A1* | 4/2022 | Zhou | H02M 3/1586 |
| 2023/0057705 A1* | 2/2023 | You | H02M 3/1582 |
| 2023/0194625 A1* | 6/2023 | Zafarana | H02M 1/32 |
| | | | 324/764.01 |

OTHER PUBLICATIONS

U.S. Appl. No. 17/141,528, filed Jan. 5, 2021, Monolithic Power Systems.
U.S. Appl. No. 17/352,519, filed Jun. 21, 2021, Monolithic Power Systems.
U.S. Appl. No. 17/399,284, filed Aug. 11, 2021, Monolithic Power Systems.

* cited by examiner

*Primary Examiner* — Alex Torres-Rivera
(74) *Attorney, Agent, or Firm* — Perkins Coie LLP

(57) ABSTRACT

A trans-inductor voltage regulator with fault detection has a plurality of transformers. Each transformer of the plurality of the transformers has a primary winding coupled to a switching circuit, and a secondary winding. Each secondary winding of each transformer of the plurality of transformers are coupled in series with a compensation inductor. The trans-inductor further has a controller operable to detect a) a short condition in a secondary side of each transformer of the plurality of transformers, b) a short condition between a primary side and the secondary side of each transformer of the plurality of transformers; c) an open condition in the primary side of each transformer of the plurality of transformers; and d) an open condition in the secondary side of each transformer of the plurality of transformers.

27 Claims, 9 Drawing Sheets

TRANS-INDUCTOR VOLTAGE REGULATORS WITH FAULT DETECTION AND THE FAULT DETECTION METHOD THEREOF

FIELD

The present invention generally refers to electrical circuits, and more particularly, but not exclusively refers to trans-inductor voltage regulators with fault detection.

BACKGROUND

In power conversion applications, an interleaved multi-phase power supply is widely used in large power and large current conditions since the interleaved multi-phase power supply may be able to provide a large output current with small current ripples, optimized thermal and power distributions.

A trans-inductor voltage regulator (TLVR) is a type of multi-phase voltage regulator that uses a winding of a transformer as an output inductor. In a multiphase TLVR circuit, a winding (e.g. a primary winding) of a transformer is employed as an output inductor of a phase, and the other windings (e.g. secondary windings) of the transformers of all the phases are connected in a series loop to ground. Because of the series connection of the other windings, all of the phases are able to respond to a change in load current, allowing for a faster transient response compared to conventional voltage regulators.

An improved TLVR circuit adopts a compensation inductor $L_C$ connected in series with the secondary windings of the transformer, as shown in FIG. 1. The compensation inductor $L_C$ is nonlinear in that the inductance is not a constant throughout the entire operating region. More particularly, the compensation inductor $L_C$ is configured to have an inductance that is large when the compensation inductor current (i.e., current flowing through the compensation inductor $L_C$) is low and an inductance that is small when the compensation inductor current is high. Such improved TLVR circuit has quick response in transient state condition and low output ripple in steady state condition.

But in real applications, open and/or short of the trans-inductor (TL) pins may happen. For example, in FIG. 1, there may exist: a) phase to inner pad short, e.g., phase N-1 in the primary side may be short to the secondary side, as shown the dashed path A in FIG. 1; b) inner to inner pad short, i.e., two ends of the secondary winding may be short, as shown the dashed path B in FIG. 1; c) phase open, i.e., a certain phase in the primary side may be open, causing the primary winding to be disconnected to an output of the TLVR circuit, as shown a symbol "x" (also marked as C) in FIG. 1; d) inner pad to output short, i.e., the output of the TVLR circuit may be short to the secondary side, as shown the dashed path D in FIG. 1; e) output pad open, i.e., the output of the TLVR circuit may be open, causing the primary winding and the output of the TLVR circuit to be disconnected, as shown the symbol "x" (also marked as E) in FIG. 1; and f) inner pad open, i.e., the secondary side loop may be open, as shown the symbol "x" (also marked as F) in FIG. 1.

However, each of the trans-inductors has four pads. For example, referring to the trans-inductor T-2, four pads 1, 2, 3 and 4 are formed thereon, wherein pad 1 and pad 4 are respectively connected to the output ($V_O$) of the TLVR circuit and a switch node SW of the TLVR circuit's power stage, while the remained two pads 2 & 3 (two ends T1 & T2 of the secondary winding) are not connected to external circuits and would be hidden from view after being soldered on the board. Because of the hidden pins 2 & 3, it is hard to detect the open and/or short of the trans-inductor pins through regular techniques.

SUMMARY

It is an object of the present invention to provide an improved TLVR circuit, which solves the above problems.

In accomplishing the above and other objects, there has been provided, in accordance with an embodiment of the present invention, a trans-inductor voltage regulator, comprising: a plurality of transformers, wherein each transformer of the plurality of transformers having a primary winding and a secondary winding, and wherein each secondary winding of each transformer of the plurality of transformers are coupled in series; a plurality of switching circuits connected in parallel between an input voltage and an output voltage, wherein each switching circuit of the plurality of switching circuits is coupled to the primary winding of each transformer of the plurality of transformers, so that each primary winding of each transformer of the plurality of transformers serves as an output inductor of each switching circuit of the plurality of switching circuits; a compensation inductor coupled in series to the secondary windings of the plurality of transformers; and a controller, configured to provide a PWM signal to each of the plurality of switching circuits, wherein the controller is configured to detect open and/or short fault conditions in each transformer of the plurality of transformers, by powering up the plurality of switching circuits one by one, or by firing a series of PWM pulses on one switching circuit of the plurality of switching circuits, while having the PWM signals provided to the other switching circuits of the plurality of switching circuits be pulled low.

In accomplishing the above and other objects, there has been provided, in accordance with an embodiment of the present invention, a fault detection method used in a trans-inductor voltage regulator, the trans-inductor voltage regulator including a plurality of transformers, wherein each transformer of the plurality of transformers having a primary winding and a secondary winding, and wherein each secondary winding of each transformer of the plurality of transformers are coupled in series with a compensation inductor, and each primary winding of each transformer of the plurality of transformers is coupled to a switching circuit of a plurality of switching circuits, to serve as an output inductor of the switching circuit of the plurality of switching circuits, the method comprising: powering up each of the plurality of switching circuits one by one, to form a single phase regulator during when a specific switching circuit of the plurality of switching circuits is powered up; detecting whether the single phase regulator is powered up normally or whether there is a fault; reporting fault if a fault is detected; and powering up a next switching circuit if no fault is detected.

In accomplishing the above and other objects, there has been provided, in accordance with an embodiment of the present invention, a fault detection method used in a trans-inductor voltage regulator, the trans-inductor voltage regulator including a plurality of transformers, wherein each transformer of the plurality of transformers having a primary winding and a secondary winding, and wherein each secondary winding of each transformer of the plurality of transformers are coupled in series with a compensation inductor, and each primary winding of each transformer of the plurality of transformers is coupled to a switching circuit of a plurality of switching circuits, the method comprising: providing a series of PWM pulses to fire any one switching circuit of the plurality of switching circuits, and pulling PWM signals provided to other switching circuits of the plurality of switching circuits to be low; comparing a current sense signal indicative of a current flowing through any one switching circuit of the plurality of switching circuits whose PWM signal is pulled low with a current threshold, to detect whether there is an open condition in a secondary side of the corresponding transformer; reporting fault if the open condition is detected; and ending the detection if no open condition is detected.

The use of the similar reference label in different drawings indicates the same of like components.

DETAILED DESCRIPTION

Embodiments of circuits for trans-inductor voltage regulator are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 2:
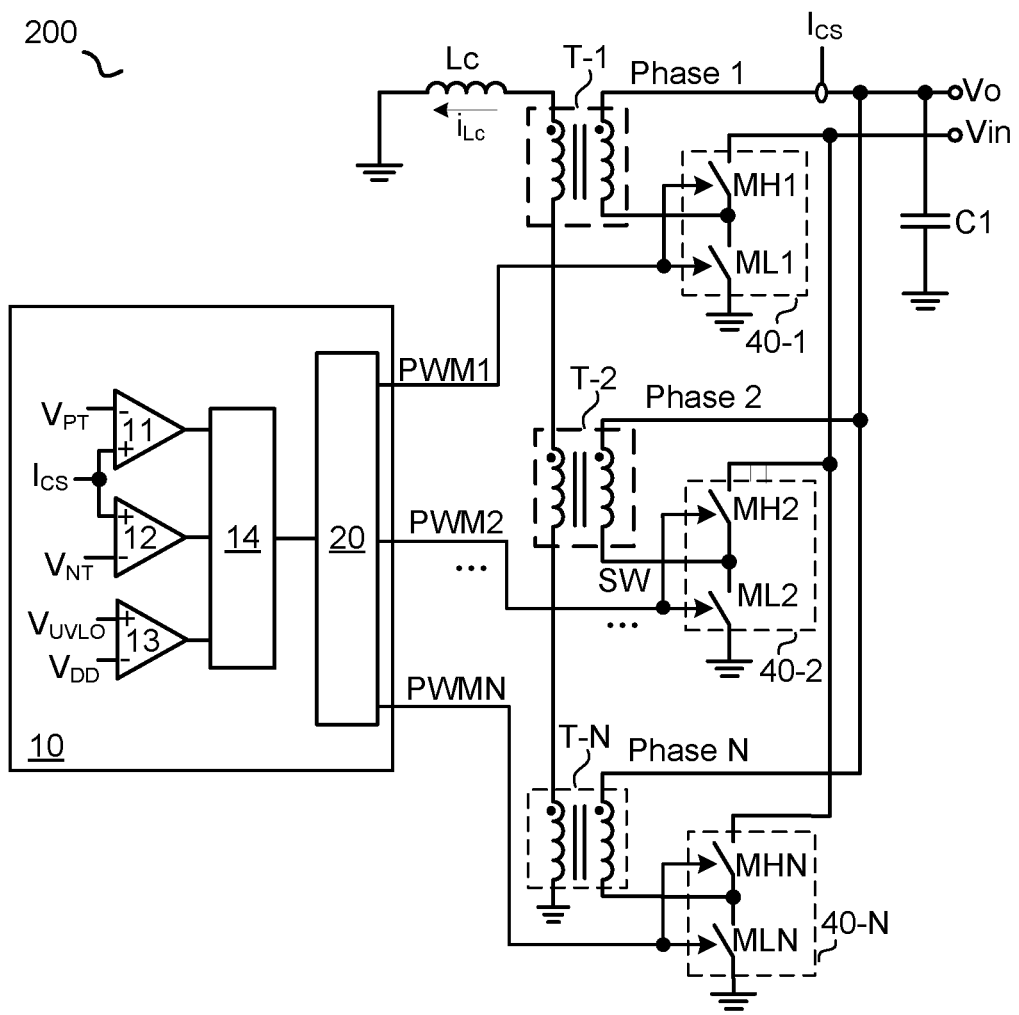
FIG. 2 schematically shows a trans-inductor voltage regulator (TLVR) circuit diagram 200 in accordance with an embodiment of the present invention.

FIG. 2 schematically shows a trans-inductor voltage regulator (TLVR) circuit diagram 200 in accordance with an embodiment of the present invention. In the example of FIG. 2, the TLVR circuit 200 is a multiphase TLVR with N phases, wherein N is an integer. As shown in FIG. 2, the TLVR circuit 200 is configured to receive an input voltage Vin and provide an output voltage $V_O$ to a load, such as CPU (central processing unit), GPU (graphics processing unit), and other ASICs (application specific integrated circuits).

Figure 3:
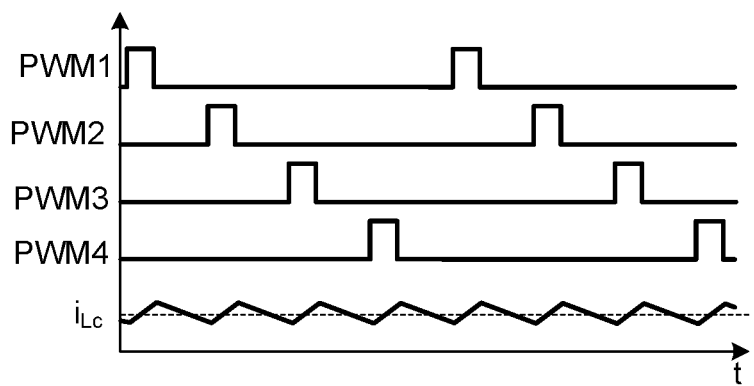
FIG. 3 schematically shows a timing diagram of the PWM signals and the inductor current $i_{LC}$ when the TLVR circuit operates under normal condition in accordance with an embodiment of the present invention.

In the example of FIG. 2, The TLVR circuit 200 comprises a plurality of switching circuits (i.e., 40-1, 40-2, . . . , 40-N), one switching circuit for each phase, and N is an integer greater than 2. The switching circuits 40-1, 40-2, . . . , 40-N are for phase 1, phase 2, . . . , phase N, respectively. The plurality of switching circuits 40-1, 40-2, . . . , 40-N are connected in parallel between the input voltage Vin and the output voltage $V_O$. And each of the plurality of switching circuits may be a buck regulator comprising a high-side switch (i.e. MH1, MH2, . . . , MHN) and a low-side switch (i.e. ML1, ML2, . . . , MLN). In the example of FIG. 2, each of the plurality of switching circuits has a corresponding transformer (i.e. T-1, T-2, . . . , T-N) whose primary winding serves as the output inductor. For example, referring to the switching circuit 40-1, a transformer T-1 has a primary winding with a first end that is connected to a switch node SW of the switches MH1 and ML1 and a second end that is connected to the output voltage $V_O$. The high-side switch MH1 is connected to the input voltage Vin, and the low-side switch ML1 is connected to a reference ground. The switches MH1 and ML1 are driven by a corresponding pulse width modulation (PWM) signal provided by a controller 10. The PWM signals of all the phases (i.e., PWM1, PWM2, . . . , PWMN) are interleaved to charge an output capacitor C1 to develop the output voltage $V_O$. For example, in a switching cycle, each of the PWM signals (i.e., PWM1, PWM2, . . . , PWMN) are provided to the corresponding switching circuit (40-1, 40-2, . . . , 40-N) to control the high-side switch (MH1, MH2, . . . , MHN) and the low-side switch (ML1, ML2, . . . , MLN) to be turned on for a certain time, as shown in FIG. 3. The secondary winding of the transformer T-1 is connected in series with the secondary windings of transformers T-2, . . . , T-N of the switching circuits 40-2, . . . , 40-N, respectively. A compensation inductor $L_C$ is connected in series with the secondary windings of the transformers T-1, T-2, . . . , T-N. The compensation inductor line (i.e., the series-connected compensation inductor $L_C$ and the secondary windings of transformers T-1, T-2, . . . , T-N) is grounded on both ends, thus forming a loop. Each transformer may have a primary to secondary turn ratio of 1:1, for example.

In the example of FIG. 2, the controller 10 comprises a driver 20, configured to provide the PWM signals of all the phases (i.e., PWM1, PWM2, . . . , PWMN as shown in FIG. 2). The controller 10 is configured to perform fault detection such as trans-inductor's (TL's) primary-secondary short detection, TL's secondary side short detection, phase open detection, etc.

Specifically, the controller 10 is configured to compare a current sense signal $I_{CS}$ indicative of a current flowing through the active phases (i.e., the current flowing through the corresponding switching circuit when the high-side switch and the low-side switch are driven by the corresponding PWM signal) with a positive threshold $V_{PT}$, to detect whether there is a short condition between TL's primary side and secondary side. The controller 10 may comprise a first comparator 11 to perform the comparison, for example.

In the example of FIG. 2, the controller 10 is further configured to compare the current sense signal $I_{CS}$ with a negative threshold $V_{NT}$, to detect whether there is a short condition in TL's secondary side. The controller 10 may comprise a second comparator 12 to perform the comparison, for example.

In the example of FIG. 2, the controller 10 is further configured to compare a signal (e.g. a feedback voltage $V_{FB}$) indicative of the output voltage $V_O$ with an under voltage threshold $V_{UCP}$, to detect whether there is an open condition in TI's primary side. The controller 10 may comprise an under voltage detector 13 to perform the comparison, for example.

In the example of FIG. 2, the controller 10 further comprises a control circuit 14, configured to trigger a fault report in response to comparison results of the first comparator 11, the second comparator 12 and the under voltage detector 13.

Figure 1:
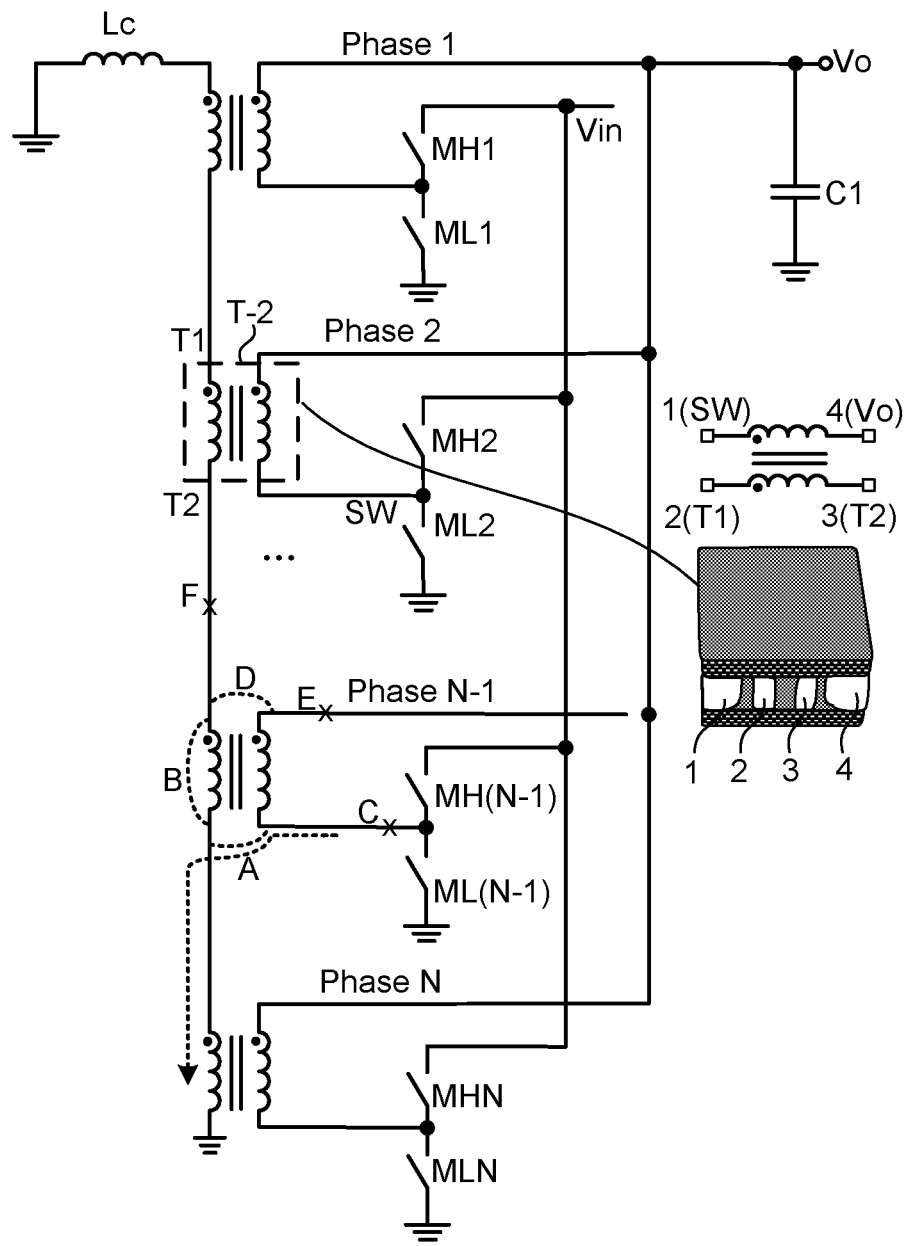
FIG. 1 schematically shows a typical trans-inductor voltage regulator (TLVR) circuit 100 in the prior art.
Figure 4A:
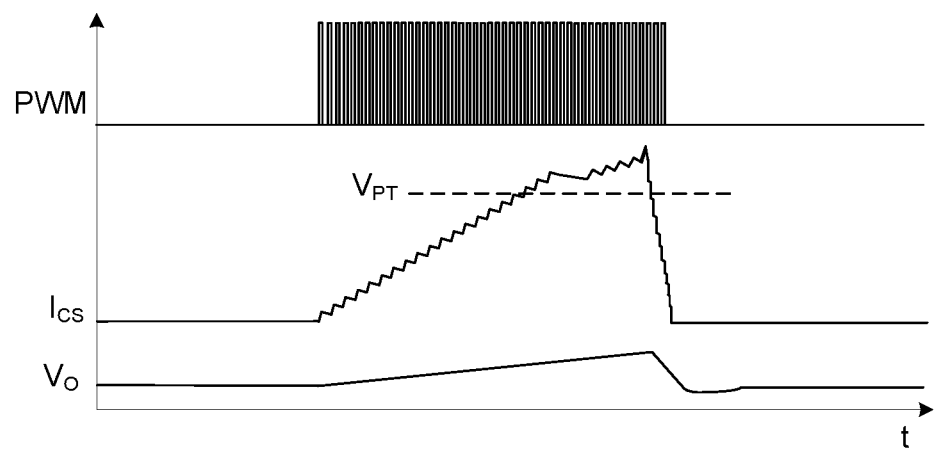
FIG. 4A schematically shows a timing diagram of signals of the TLVR circuit 200 when a primary-secondary short condition happens in accordance with an embodiment of the present invention.
Figure 4B:
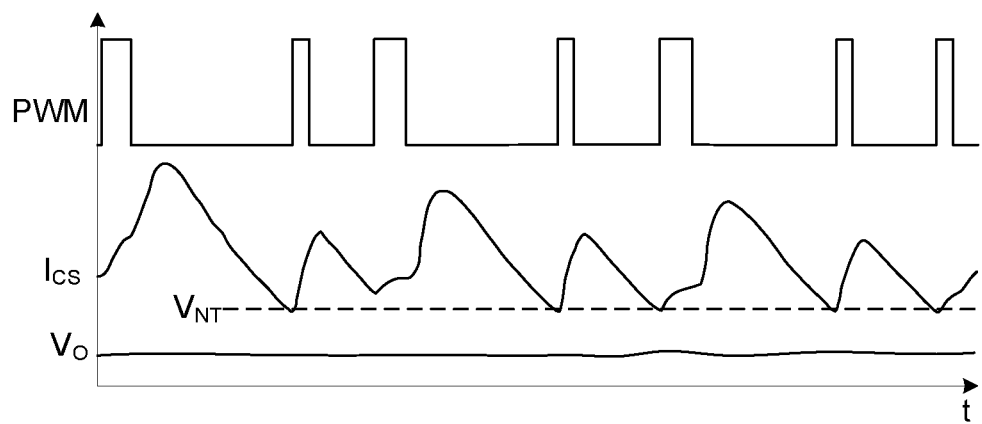
FIG. 4B schematically shows a timing diagram of signals of the TLVR circuit 200 when a short condition happens in TL's secondary side in accordance with an embodiment of the present invention.

In one embodiment of the present invention, the open and/or short condition is detected by phase-by-phase power up test, i.e., by powering up the phases one by one. Specifically, all of the switching circuits 40-1, 40-2, . . . , 40-N are boot up (i.e., provided with PWM signals) one by one. When a specific switching circuit (e.g. the first switching circuit 40-1) is powered up, other switching circuits are idle (i.e., no PWM signal is provided to other circuits). Then, a single-phase buck regulator is formed. The controller 10 continuously provides PWM signals to this switching circuit, to generate the desired output voltage $V_O$, until a shut-down instruction is received or until an instruction of powering up the next switching circuit is received. All of the switching circuits are powered up in such way, so as to detect whether there is an open and/or short condition in each of the transformers. If TL's primary-secondary short (e.g., fault condition a) phase to inner pad short or fault condition d) inner pad to output short as discussed hereinbefore with reference to FIG. 1) happens at one of the switching circuits, the output voltage $V_O$ will be pulled to zero when the corresponding switching circuit is powered up. Thus, the current flowing through the corresponding switching circuit would rise rapidly, which causes the current sense signal $I_{CS}$ to touch the positive threshold $V_{PT}$, as shown in FIG. 4A. Consequently, the control circuit 14 would be triggered by the first comparator 11 to report the fault condition. If the short condition in TL's secondary side (e.g. fault condition b) inner to inner pad short as discussed hereinbefore with reference to FIG. 1) happens at one of the switching circuits, the inductance of the corresponding switching circuit goes very low. So when the corresponding switching circuit is powered up, large current ripple will occur. During the turn-on period of the low-side switch, the inductor current falls down to zero, and inversely increases to a negative current value. Accordingly, the current sense signal $I_{CS}$ would touch the negative threshold $V_{NT}$, as shown in FIG. 4B. Consequently, the control circuit 14 would be triggered by the second comparator 12 to report the fault condition. If TL's primary side open condition (e.g., c) phase open or e) output pad open as discussed hereinbefore with reference to FIG. 1) happens at one of the switching circuits, the output voltage $V_O$ would not go up, triggering under voltage protection, thus indicating the fault condition.

In the example of FIG. 2, the control circuit 14 is also configured to receive other control signals (not shown), to control the driver 20 to provide appropriate PWM signals.

Figure 5:
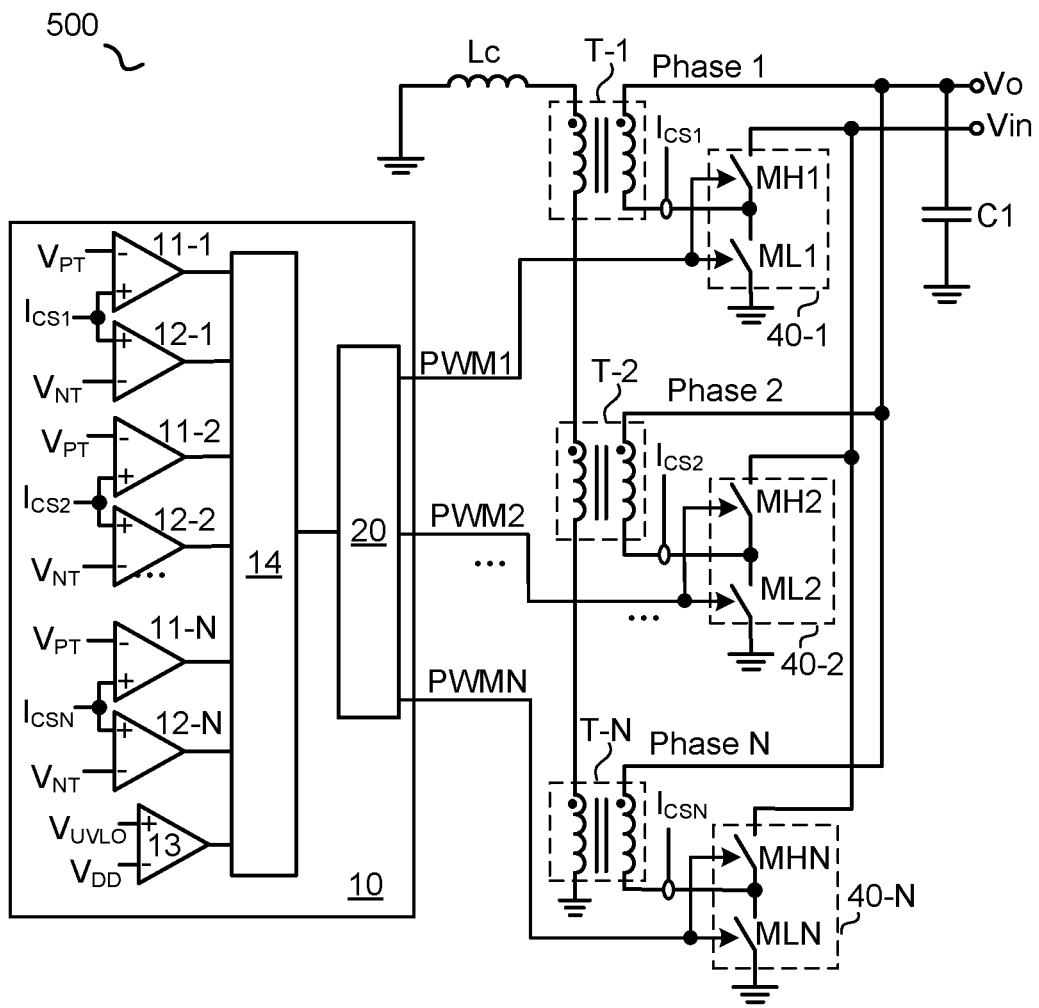
FIG. 5 schematically shows a trans-inductor voltage regulator (TLVR) circuit diagram 500 in accordance with an embodiment of the present invention.

In the example of FIG. 2, the current sense signal $I_{CS}$ is illustrated as the current of the switching circuit 40-1. However, one skilled in the art should realize that the controller 10 may be configured to receive N current sense signals respectively from the N switching circuits 40-1, 40-2, . . . , 40-N, as shown in FIG. 5. The controller 10 is configured to compare each of the current sense signals (i.e. $I_{CS1}, I_{CS2}, \ldots, I_{CSN}$) with the positive threshold $V_{PT}$ and the negative threshold $V_{NT}$, to detect TL's primary-secondary short condition and TL's secondary side short condition.

Figure 6:
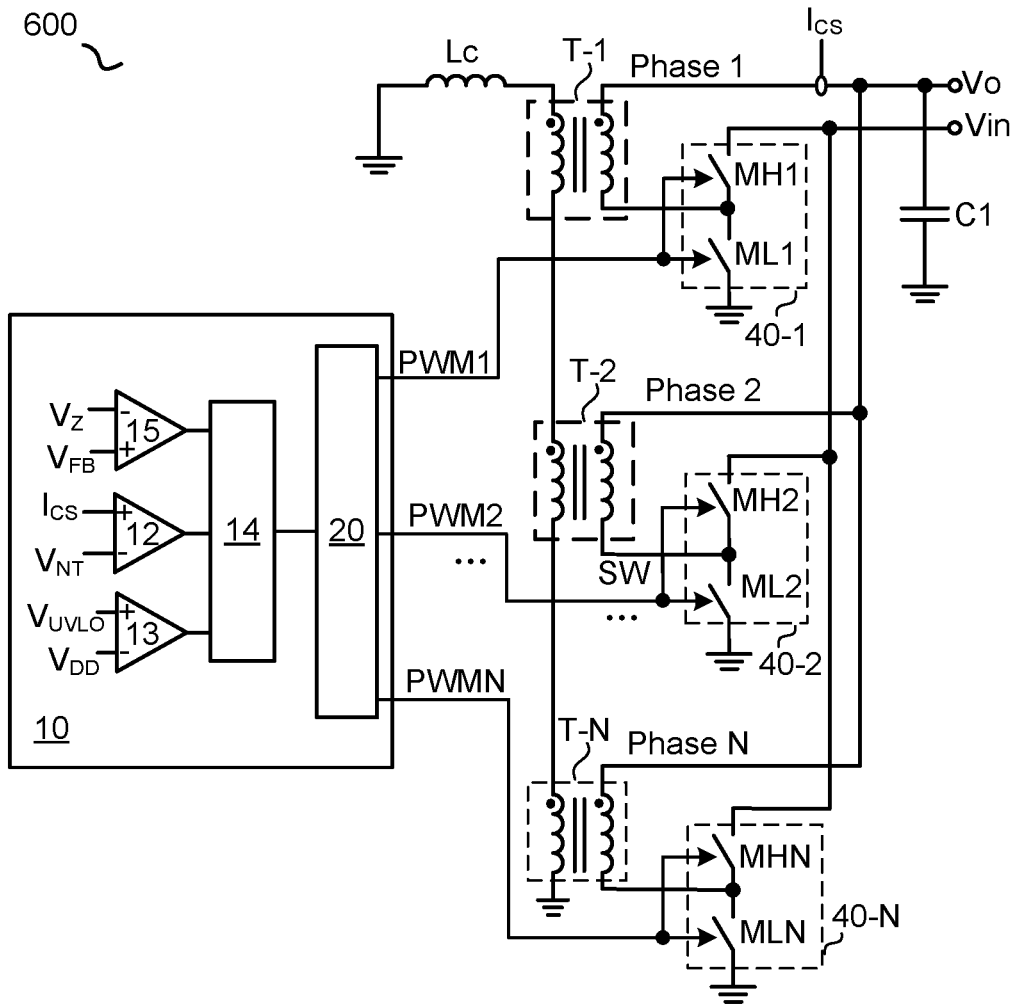
FIG. 6 schematically shows a trans-inductor voltage regulator (TLVR) circuit diagram 600 in accordance with an embodiment of the present invention.

FIG. 6 schematically shows a trans-inductor voltage regulator (TLVR) circuit diagram 600 in accordance with an embodiment of the present invention. The TLVR circuit 600 in FIG. 6 is similar to the TLVR circuit 200 in FIG. 2, with a difference that in the TLVR circuit 600, the controller 10 is not configure to compare the current sense signal $I_{CS}$ with the positive threshold $V_{PT}$ to detect a primary-secondary short condition. Instead, the controller 10 in the TLVR circuit 600 is configure to compare the feedback voltage $V_{FB}$ indicative of the output voltage $V_O$ of the TLVR circuit with a zero voltage reference $V_Z$, to detect whether there is a short condition between TL's primary side and secondary side. If the feedback voltage $V_{FB}$ is lower than the zero voltage reference $V_Z$, the control circuit 14 is triggered, to report a fault condition. In the example of FIG. 6, the controller 10 comprises a voltage comparator 15 to perform the comparison of the feedback voltage $V_{FB}$ and the zero voltage reference $V_Z$.

In the example of FIG. 6, the TL's secondary side short condition and the primary side open would be detected respectively by the second comparator 12 and the under voltage detector 13 as that in the example of FIG. 2.

Figure 7:
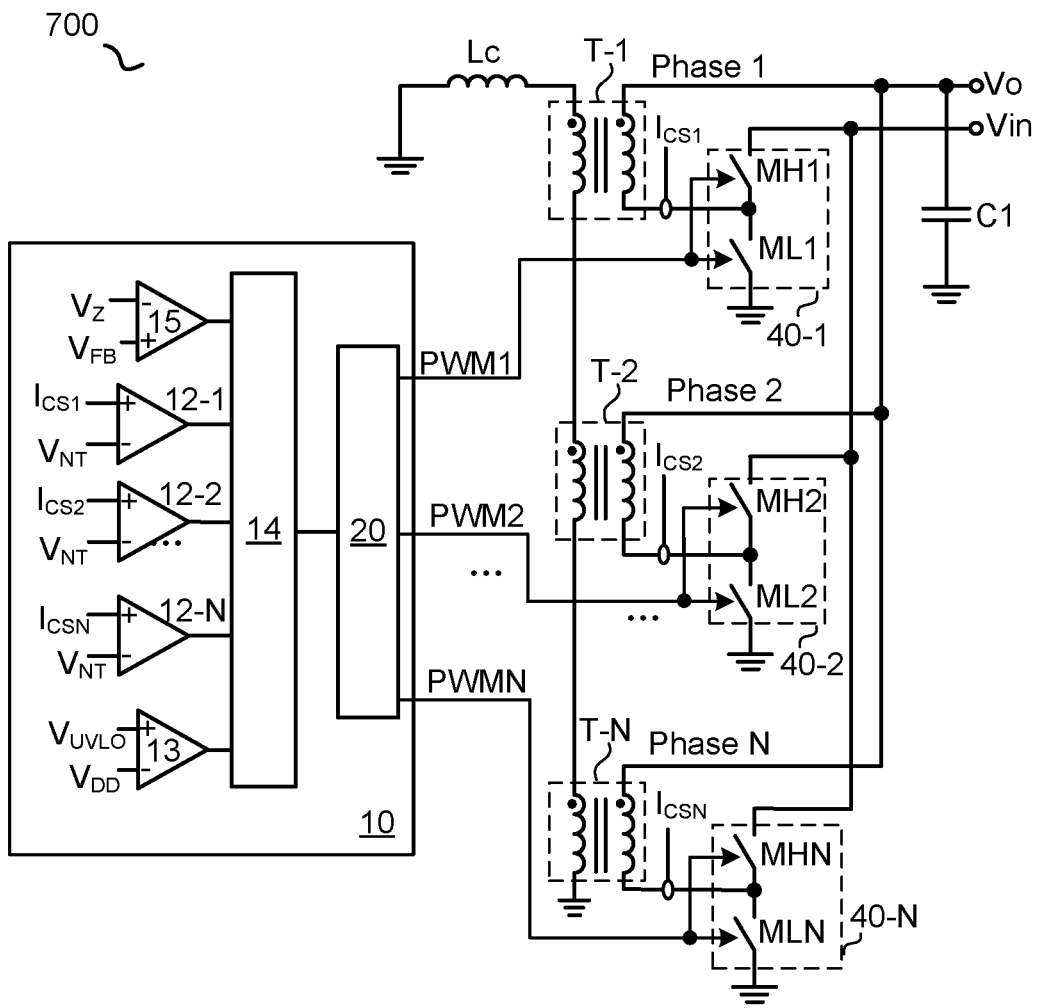
FIG. 7 schematically shows a trans-inductor voltage regulator (TLVR) circuit diagram 700 in accordance with an embodiment of the present invention.

In one embodiment of the present invention, the controller 10 may be configured to receive N current sense signals $I_{CS1}, I_{CS2}, \ldots, I_{CSN}$ respectively from the N switching circuits 40-1, 40-2, . . . , 40-N, as shown in FIG. 7. The controller 10 is configured to compare each of the current sense signals with the negative threshold $V_{NT}$, to detect TL's secondary side short condition.

Figure 8:
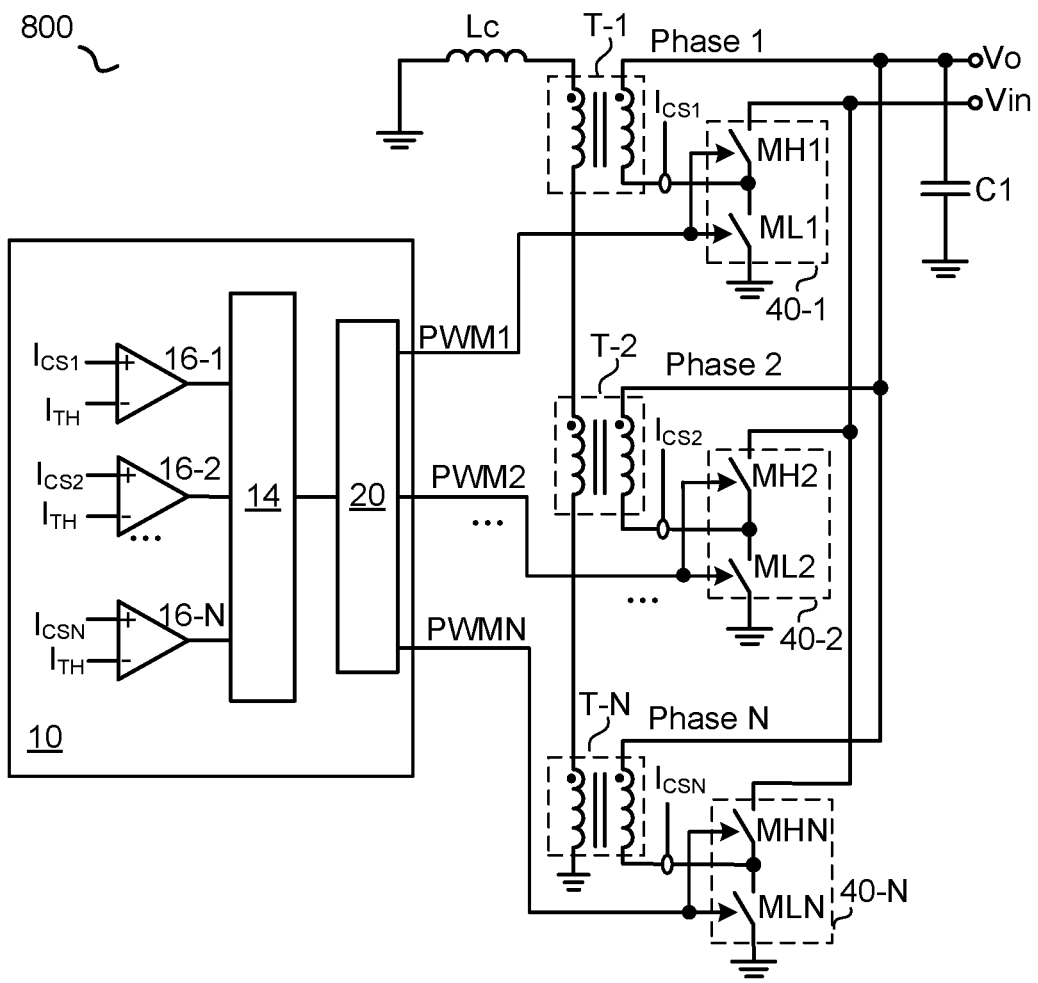
FIG. 8 schematically shows a trans-inductor voltage regulator (TLVR) circuit diagram 800 in accordance with an embodiment of the present invention.

FIG. 8 schematically shows a trans-inductor voltage regulator (TLVR) circuit diagram 800 in accordance with an embodiment of the present invention. In the example of FIG. 8, the TLVR circuit 800 comprises similar switching circuits (i.e., 40-1, 40-2, . . . , 40-N), corresponding transformers (i.e., T-1, T-2, . . . , T-N), the compensation inductor $L_C$ and the controller 10 as that in FIGS. 2, 5, 6, and 7. In the example of FIG. 8, the controller 10 is further configured to perform TL's secondary side loop open detection using TLVR coupling verification method.

Specifically, in the example of FIG. 8, the controller 10 comprises a driver 20 configured to provide a series of PWM pulses to any one switching circuit (e.g. 40-1) of the plurality of switching circuits, to turn on and/or off the corresponding switches MH1 and ML1; and to pull the other PWM signals to be low (i.e., to turn on the low-side switch in the other switching circuits 40-2, . . . , 40-N). In addition, the controller 10 further comprises a plurality of current comparators (i.e., 16-1, 16-2, . . . , 16-N), configured to respectively compare a current sense signal (i.e. $I_{CS1}, I_{CS2}, \ldots, I_{CSN}$) indicative of a current flowing through the switching circuits (i.e., 40-1, 40-2, . . . , 40-N) with a current threshold $I_{TH}$, to detect whether there is an open condition in TL's secondary side.

If the TLVR circuit 800 is not open at TL's secondary side, because of the series of PWM pulses, current would flow through the output inductor (i.e., the primary winding of the transformer). As a result, TL's secondary winding induces a current, which would cause current to flow through the low-side switch M2 in the other switching circuit. Then, each of the current comparators (i.e., 16-1, 16-2, ..., 16-N) would send a signal to the control circuit 14 to indicate the normal coupling of the TL's secondary side. On the contrary, if there is an open condition in TL's secondary side, no current would flow through TL's secondary winding. Only the current comparator 16-1 would send a signal to the control circuit 14, and no signals from other current comparators would be sent to the control circuit 14 to report the normal coupling status. Consequently, the control circuit 14 would report the fault of TL's secondary side loop open condition.

Figure 9:
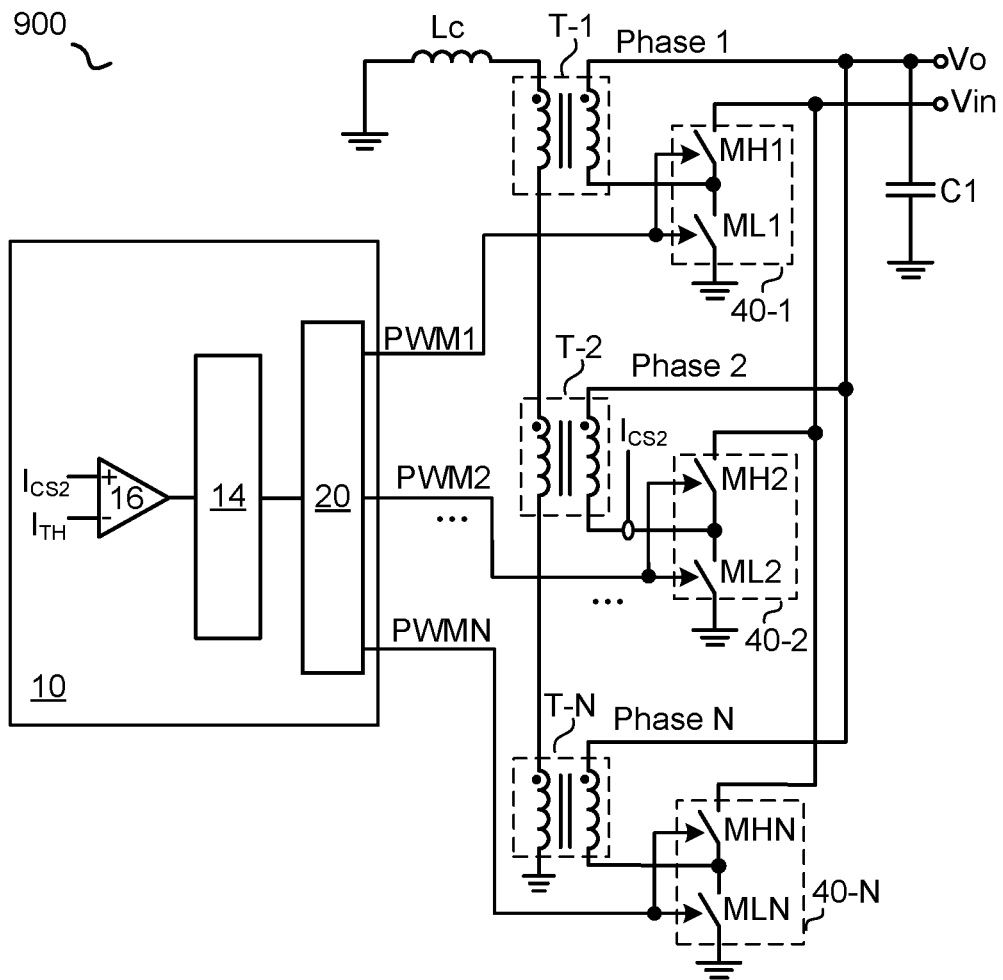
FIG. 9 schematically shows a trans-inductor voltage regulator (TLVR) circuit diagram 900 in accordance with an embodiment of the present invention.

In the example of FIG. 8, the controller 10 is illustrated as configured to receive N current sense signals $I_{CS1}$, $I_{CS2}$, ..., $I_{CSN}$ respectively from the N switching circuits 40-1, 40-2, ..., 40-N. However, one skilled in the art should realize that the controller 10 may be configured to include one current comparator 16 to compare the current sense signal indicative of a current flowing through any one of the unfired switching circuits (i.e. the switching circuits other than the switching circuit that is fired with the series of PWM pulses). As shown in FIG. 9, a TVLR circuit diagram 900 with a controller having a current comparator 16 is schematically shown in accordance with an embodiment of the present invention. Specifically, in the example of FIG. 9, the controller 10 is configured to fire a series of PWM pulses on one of the switching circuits, and the other PWM signals provided to the other switching circuits are pulled low. For example, PWM1 may be fired with a series of pulses, and the remained PWM signals, i.e., PWM2, ..., PWMN are pulled low. The current flowing through the second switching circuit 40-2 is sensed as $I_{CS2}$ and is compared with the current threshold $I_{TH}$. If there is an open condition in TL's secondary side, no current would flow through TL's secondary winding. Thus, the current sense signal $I_{CS2}$ keeps lower than the current threshold $I_{TH}$, and no signal is sent to the control circuit 14 to report the normal coupling status. Consequently, the control circuit 14 would report fault of TL's secondary side loop open condition.

Figure 10:
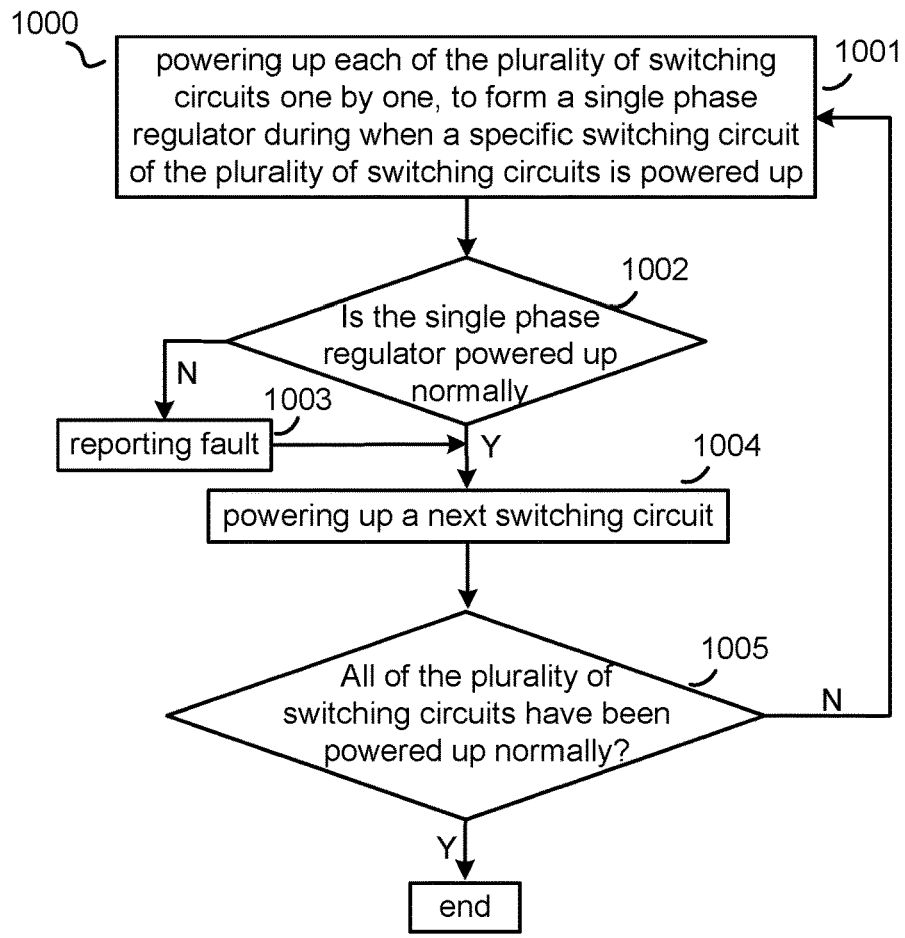
FIG. 10 schematically shows a flowchart 1000 of a fault detection method used in a trans-inductor voltage regulator in accordance with an embodiment of the present invention.

FIG. 10 schematically shows a flowchart 1000 of a fault detection method used in a trans-inductor voltage regulator in accordance with an embodiment of the present invention. The trans-inductor voltage regulator includes a plurality of transformers, wherein each transformer of the plurality of transformers having a primary winding and a secondary winding, and wherein each secondary winding of each transformer of the plurality of transformers are coupled in series with a compensation inductor, and each primary winding of each transformer of the plurality of transformers is coupled to a switching circuit of a plurality of switching circuits. The method comprises:

Step 1001, powering (i.e., booting) up each of the plurality of switching circuits one by one, to form a single phase regulator during when a specific switching circuit of the plurality of switching circuits is powered up.

Step 1002, detecting whether the single phase regulator is powered up normally or whether there is a fault. If a fault is detected, going to step 1003, if no fault is detected, going to step 1004.

Step 1003, reporting fault.

Step 1004, powering up a next switching circuit.

Step 1005, detecting whether all of the plurality of switching circuits have been powered up normally. If yes, going to step 1006, to end the detection.

In one embodiment of the present invention, the method further comprises: comparing a current sense signal indicative of a current flowing through the specific switching circuit being powered up with a positive threshold. If the current sense signal is higher than the positive threshold, a short condition between the corresponding trans-inductor's (i.e., transformer's) primary side and secondary side is detected.

In one embodiment of the present invention, the method further comprises: comparing the current sense signal indicative of a current flowing through the specific switching circuit being powered up with a negative threshold. If the current sense signal is lower than the negative threshold, a short condition in the corresponding trans-inductor's secondary side is detected.

In one embodiment of the present invention, the method further comprises: comparing a signal indicative of the output voltage of the trans-inductor voltage regulator with an under voltage threshold. If the signal indicative of the output voltage is lower than the under voltage threshold, an open condition in the corresponding trans-inductor's primary side of the specific switching circuit being powered up is detected.

Figure 11:
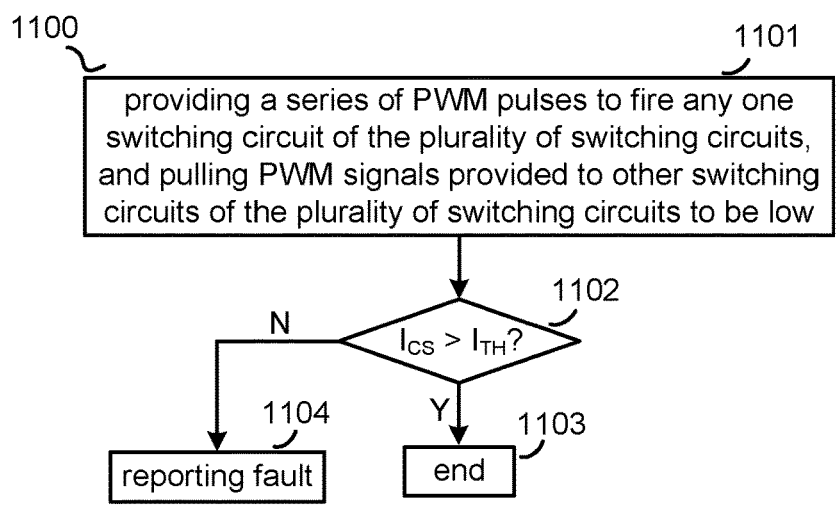
FIG. 11 schematically shows a flowchart 1100 of a fault detection method used in a trans-inductor voltage regulator in accordance with an embodiment of the present invention.

FIG. 11 schematically shows a flowchart 1100 of a fault detection method used in a trans-inductor voltage regulator in accordance with an embodiment of the present invention. The trans-inductor voltage regulator includes a plurality of transformers, wherein each transformer of the plurality of transformers having a primary winding and a secondary winding, and wherein each secondary winding of each transformer of the plurality of transformers are coupled in series with a compensation inductor, and each primary winding of each transformer of the plurality of transformers is coupled to a switching circuit of a plurality of switching circuits. The method comprises:

Step 1101, providing a series of PWM pulses to fire any one switching circuit of the plurality of switching circuits, and pulling PWM signals provided to other switching circuits of the plurality of switching circuits to be low.

Step 1102, comparing a current sense signal ($I_{CS}$) indicative of a current flowing through any one of the switching circuit of the plurality of switching circuits whose PWM signal is pulled low with a current threshold ($I_{TH}$), to detect whether there is an open condition in the corresponding trans-inductor's secondary side. If the current sense signal is higher than the current threshold, going to step 1103; otherwise, going to step 1104.

Step 1103, ending the detection.

Step 1104, reporting fault.

In one embodiment of the invention, the current sense signal is indicative of the current flowing through all of the plurality of switching circuits whose PWM signal are pulled low.

Several embodiments of the foregoing trans-inductor voltage regulator detect short and open conditions on TL's primary side and secondary side by simple circuit design. Unlike the conventional technique, several embodiments of the foregoing trans-inductor voltage regulator use phase-by-phase power up test to detect TL primary-secondary short, TL secondary side short, and TL primary side open; and use TLVR coupling verification test to detect TL secondary side loop open.

What is claimed is:

1. A trans-inductor voltage regulator, comprising:
    a plurality of transformers, wherein each transformer of the plurality of transformers having a primary winding and a secondary winding, and wherein each secondary winding of each transformer of the plurality of transformers are coupled in series;
    a plurality of switching circuits connected in parallel between an input voltage and an output voltage, wherein each switching circuit of the plurality of switching circuits is coupled to the primary winding of each transformer of the plurality of transformers, so that each primary winding of each transformer of the plurality of transformers serves as an output inductor of each switching circuit of the plurality of switching circuits;
    a compensation inductor coupled in series to the secondary windings of the plurality of transformers; and
    a controller, configured to power up the plurality of switching circuits one by one by firing a series of PWM pulses on one of the plurality of switching circuits and keeping other switching circuits idle during when a specific switching circuit of the plurality of switching circuits is powered up, to detect open and short fault conditions of the plurality of switching circuits.

2. The trans-inductor voltage regulator of claim 1, wherein:
    the controller is configured to compare a current sense signal with a positive threshold, to detect a short condition between a primary side and a secondary side of each transformer of the plurality of transformers, and the controller is configured to compare the current sense signal with a negative threshold, to detect a short condition in the secondary side of each transformer of the plurality of transformers; and wherein
    the current sense signal is indicative of a current flowing through a powered up switching circuit.

3. The trans-inductor voltage regulator of claim 1, wherein:
    the controller is configured to compare a signal indicative of the output voltage with an under voltage threshold to detect an open condition in a primary side of each transformer of the plurality of transformers.

4. The trans-inductor voltage regulator of claim 1, wherein:
    the controller is configured to compare a current sense signal with a negative threshold, to detect a short condition in the secondary side of each transformer of the plurality of transformers, wherein the current sense signal is indicative of a current flowing through a powered up switching circuit.

5. The trans-inductor voltage regulator of claim 1, wherein:
    the controller is configured to compare a signal indicative of the output voltage with a zero voltage reference, to detect a short condition between a primary side and a secondary side of each transformer of the plurality of transformers.

6. The trans-inductor voltage regulator of claim 1, wherein:
    the controller is configured to compare a plurality of current sense signals indicative of currents flowing through each of the plurality of the switching circuits with a positive threshold, to detect a short condition between a primary side and a secondary side of each transformer of the plurality of transformers, and the controller is configured to compare a plurality of current sense signals indicative of currents flowing through each of the plurality of the switching circuits with a negative threshold, to detect a short condition in the secondary side of each transformer of the plurality of transformers.

7. The trans-inductor voltage regulator of claim 1, wherein:
    the controller is configured to compare a plurality of current sense signals indicative of currents flowing through each of the plurality of the switching circuits with a negative threshold, to detect a short condition in the secondary side of each transformer of the plurality of transformers.

8. The trans-inductor voltage regulator of claim 1, wherein:
    the controller is configured to compare a plurality of current sense signals indicative of currents flowing through each of the plurality of the switching circuits with a current threshold, to detect an open condition in a secondary side of each transformer of the plurality of transformers.

9. The trans-inductor voltage regulator of claim 1, wherein:
    the controller is configured to compare a current sense signal with a current threshold, to detect an open condition in a secondary side of each transformer of the plurality of transformers, wherein the current sense signal is indicative of a current flowing through any one of the switching circuits having a low PWM signal.

10. The trans-inductor voltage regulator of claim 1, wherein:
    the controller is further configured to trigger a fault report in response to a detection of any of:
    a) a short condition in a secondary side of each transformer;
    b) a short condition between a primary side and the secondary side of each transformer of the plurality of transformers;
    c) an open condition in the primary side of each transformer of the plurality of transformers; and
    d) an open condition in the secondary side of each transformer of the plurality of transformers.

11. A fault detection method used in a trans-inductor voltage regulator, the trans-inductor voltage regulator including a plurality of transformers, wherein each transformer of the plurality of transformers having a primary winding and a secondary winding, and wherein each secondary winding of each transformer of the plurality of transformers are coupled in series with a compensation inductor, and each primary winding of each transformer of the plurality of transformers is coupled to a switching circuit of a plurality of switching circuits, to serve as an output inductor of the switching circuit of the plurality of switching circuits, the method comprising:
    powering up each of the plurality of switching circuits one by one by firing a series of PWM pulses on one of the plurality of switching circuits and keeping other switching circuits idle during when a specific switching circuit of the plurality of switching circuits is powered up;
    detecting whether the switching circuit fired with the series of PWM pulses is powered up normally or whether there is a fault;
    reporting fault if a fault is detected; and
    powering up a next switching circuit if no fault is detected.

12. The fault detection method of claim 11, further comprising:
ending the detection if all of the plurality of switching circuits have been powered up normally.

13. The fault detection method of claim 11, further comprising:
comparing a current sense signal indicative of a current flowing through the specific switching circuit being powered up with a positive threshold, if the current sense signal is higher than the positive threshold, a short condition between a primary side and a secondary side of the corresponding transformer coupled to the specific switching circuit is detected.

14. The fault detection method of claim 11, further comprising:
comparing a current sense signal indicative of a current flowing through the specific switching circuit being powered up with a negative threshold, if the current sense signal is lower than the negative threshold, a short condition in a secondary side of the corresponding transformer coupled to the specific switching circuit is detected.

15. The fault detection method of claim 11, further comprising:
comparing a signal indicative of the output voltage of the trans-inductor voltage regulator with an under voltage threshold, if the signal indicative of the output voltage is lower than the under voltage threshold, an open condition in a primary side of the corresponding transformer coupled to the specific switching circuit being powered up is detected.

16. A fault detection method used in a trans-inductor voltage regulator, the trans-inductor voltage regulator including a plurality of transformers, wherein each transformer of the plurality of transformers having a primary winding and a secondary winding, and wherein each secondary winding of each transformer of the plurality of transformers are coupled in series with a compensation inductor, and each primary winding of each transformer of the plurality of transformers is coupled to a switching circuit of a plurality of switching circuits, the method comprising:
providing a series of PWM pulses to fire any one switching circuit of the plurality of switching circuits, and pulling PWM signals provided to other switching circuits of the plurality of switching circuits to be low;
comparing a current sense signal indicative of a current flowing through any one switching circuit of the plurality of switching circuits whose PWM signal is pulled low with a current threshold, to detect whether there is an open condition in a secondary side of the corresponding transformer;
reporting fault if the open condition is detected; and
ending the detection if no open condition is detected.

17. The fault detection method of claim 16, wherein:
the current sense signal is indicative of the current flowing through all of the plurality of switching circuits whose PWM signal are pulled low.

18. A controller for a trans-inductor voltage regulator, comprising:
a driver configured to provide a plurality of PWM signals to a plurality of switching circuits of the trans-inductor voltage regulator, wherein the plurality of switching circuits are located at a primary side of the trans-inductor voltage regulator, and a plurality of secondary windings are coupled in series at a secondary side of the trans-inductor voltage regulator; wherein
the controller is configured to detect fault conditions of the trans-inductor voltage regulator, by firing a series of PWM pulses on one of the plurality of switching circuits, while having the PWM signals provided to the remaining of the plurality of switching circuits be pulled low.

19. The controller of claim 18, wherein the controller is configured to check whether there is a current flowing through any one or all of the switching circuits which are pulled low to detect an open fault condition in the secondary side of the trans-inductor voltage regulator.

20. The controller of claim 18, wherein:
the controller is configured to compare a plurality of current sense signals indicative of currents flowing through each of the plurality of the switching circuits with a current threshold, to detect an open condition in the secondary side of each transformer of the trans-inductor voltage regulator.

21. The controller of claim 18, wherein:
the controller is configured to compare a current sense signal with a current threshold, to detect an open condition in the secondary side of the trans-inductor voltage regulator, wherein the current sense signal is indicative of a current flowing through any one of the switching circuits having a low PWM signal.

22. A controller for a trans-inductor voltage regulator, comprising:
a driver configured to provide a plurality of PWM signals to a plurality of switching circuits of the trans-inductor voltage regulator, wherein the plurality of switching circuits are located at a primary side of the trans-inductor voltage regulator, and a plurality of secondary windings are coupled in series at a secondary side of the trans-inductor voltage regulator; wherein
the controller is configured to power up the plurality of switching circuits one by by firing a series of PWM pulses on one of the plurality of switching circuits and keeping other switching circuits idle during when a specific switching circuit of the plurality of switching circuits is powered up, to detect fault conditions of the trans-inductor voltage regulator.

23. The controller of claim 22, wherein:
the controller is configured to compare a current sense signal with a positive threshold, to detect a short condition between the primary side and the secondary side of the trans-inductor voltage regulator, and the controller is configured to compare the current sense signal with a negative threshold, to detect a short condition in the secondary side of the trans-inductor voltage regulator; and wherein
the current sense signal is indicative of a current flowing through a powered up switching circuit.

24. The controller of claim 22, wherein:
the controller is configured to compare a signal indicative of the output voltage with an under voltage threshold to detect an open condition in the primary side of the trans-inductor voltage regulator.

25. The controller of claim 22, wherein:
the controller is configured to compare a signal indicative of the output voltage with a zero voltage reference, to detect a short condition between the primary side and the secondary side of the trans-inductor voltage regulator.

26. The controller of claim 22, wherein:
the controller is configured to compare a plurality of current sense signals indicative of currents flowing through each of the plurality of the switching circuits with a positive threshold, to detect a short condition between the primary side and the secondary side of the trans-inductor voltage regulator, and the controller is configured to compare a plurality of current sense signals indicative of currents flowing through each of the plurality of the switching circuits with a negative threshold, to detect a short condition in the secondary side of the trans-inductor voltage regulator.

27. The controller of claim 22, wherein:
the controller is configured to check whether there is a current flowing through any one or all of the switching circuits which are pulled low to detect an open fault condition in the secondary side of the trans-inductor voltage regulator.

* * * * *